(12) United States Patent
Beckedahl et al.

(10) Patent No.: US 7,982,302 B2
(45) Date of Patent: Jul. 19, 2011

(54) POWER SEMICONDUCTOR MODULE WITH CONTROL FUNCTIONALITY AND INTEGRATED TRANSFORMER

(75) Inventors: Peter Beckedahl, Oberasbach (DE); Reinhard Herzer, Ilmenau (DE); Thomas Stockmeier, Erlangen (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 63 days.

(21) Appl. No.: 12/622,257

(22) Filed: Nov. 19, 2009

(65) Prior Publication Data

US 2010/0127379 A1 May 27, 2010

(30) Foreign Application Priority Data

Nov. 19, 2008 (DE) .......... 10 2008 057 833

(51) Int. Cl.
*H01L 23/52* (2006.01)
(52) U.S. Cl. .............. 257/691; 257/E23.141
(58) Field of Classification Search .......... 257/691–693, 257/724, E23.141, E21.499
See application file for complete search history.

(56) References Cited

U.S. PATENT DOCUMENTS

| | | | |
|---|---|---|---|
| 5,801,521 A | 9/1998 | Mizoguchi et al. | |
| 6,359,331 B1* | 3/2002 | Rinehart et al. | 257/691 |
| 6,362,525 B1* | 3/2002 | Rahim | 257/738 |
| 6,445,068 B1* | 9/2002 | Sofue et al. | 257/723 |
| 6,903,938 B2 | 6/2005 | Waffenschmidt | |
| 7,042,074 B2 | 5/2006 | Göbl et al. | |
| 7,161,241 B2* | 1/2007 | Kimura | 257/724 |
| 7,449,772 B2* | 11/2008 | Aoki | 257/691 |
| 7,495,324 B2 | 2/2009 | Popp et al. | |
| 7,521,805 B2* | 4/2009 | Lin et al. | 257/773 |
| 7,679,162 B2* | 3/2010 | Dupuis et al. | 257/531 |
| 7,791,210 B2* | 9/2010 | Miller et al. | 257/780 |
| 2006/0039127 A1* | 2/2006 | West | 361/803 |
| 2007/0029662 A1* | 2/2007 | Lee | 257/691 |
| 2007/0114651 A1* | 5/2007 | Marimuthu et al. | 257/690 |
| 2009/0072388 A1* | 3/2009 | Tews et al. | 257/724 |

FOREIGN PATENT DOCUMENTS

| | | |
|---|---|---|
| DE | 197 41 302 | 3/1999 |
| DE | 101 00 282 | 7/2002 |
| DE | 102 17 580 | 11/2003 |
| DE | 103 55 925 | 6/2005 |
| DE | 10 2006 021 412 | 11/2007 |
| EP | 1 283 663 | 2/2003 |
| EP | 1 363 296 | 11/2003 |
| EP | 1 548 829 | 6/2005 |
| JP | 6-77411 | 3/1994 |
| JP | 2005-340754 | 12/2005 |
| WO | WO 2005/013363 | 2/2005 |

* cited by examiner

*Primary Examiner* — Nathan W Ha
(74) *Attorney, Agent, or Firm* — Cohen Pontani Lieberman & Pavane LLP

(57) ABSTRACT

A power semiconductor module comprising: a substrate, a plurality of conductor tracks arranged thereon, the conductor tracks being electrically insulated from one another, and including power semiconductor components arranged thereon; a connecting device, composed of an alternating layer sequence of at least two electrically conductive layers and at least one electrically insulating layer disposed therebetween, for the circuit-conforming connection of the power semiconductor components, the conductor tracks and/or external contact devices. The electrically conductive layers form connecting tracks and at least one transformer is formed integrally with, and thus from the constituent parts of, the connecting device. The transformer is composed of at least one transmitter coil and at least one receiver coil, which are in each case arranged coaxially with respect to one another and are formed with spiral windings.

10 Claims, 2 Drawing Sheets

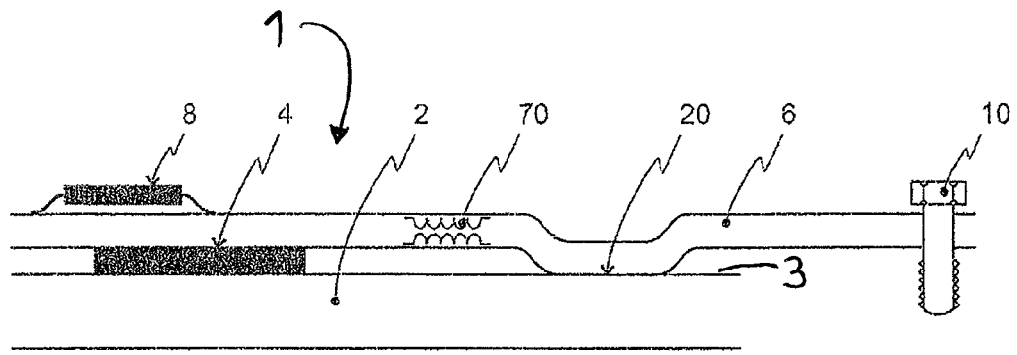
Fig. 1
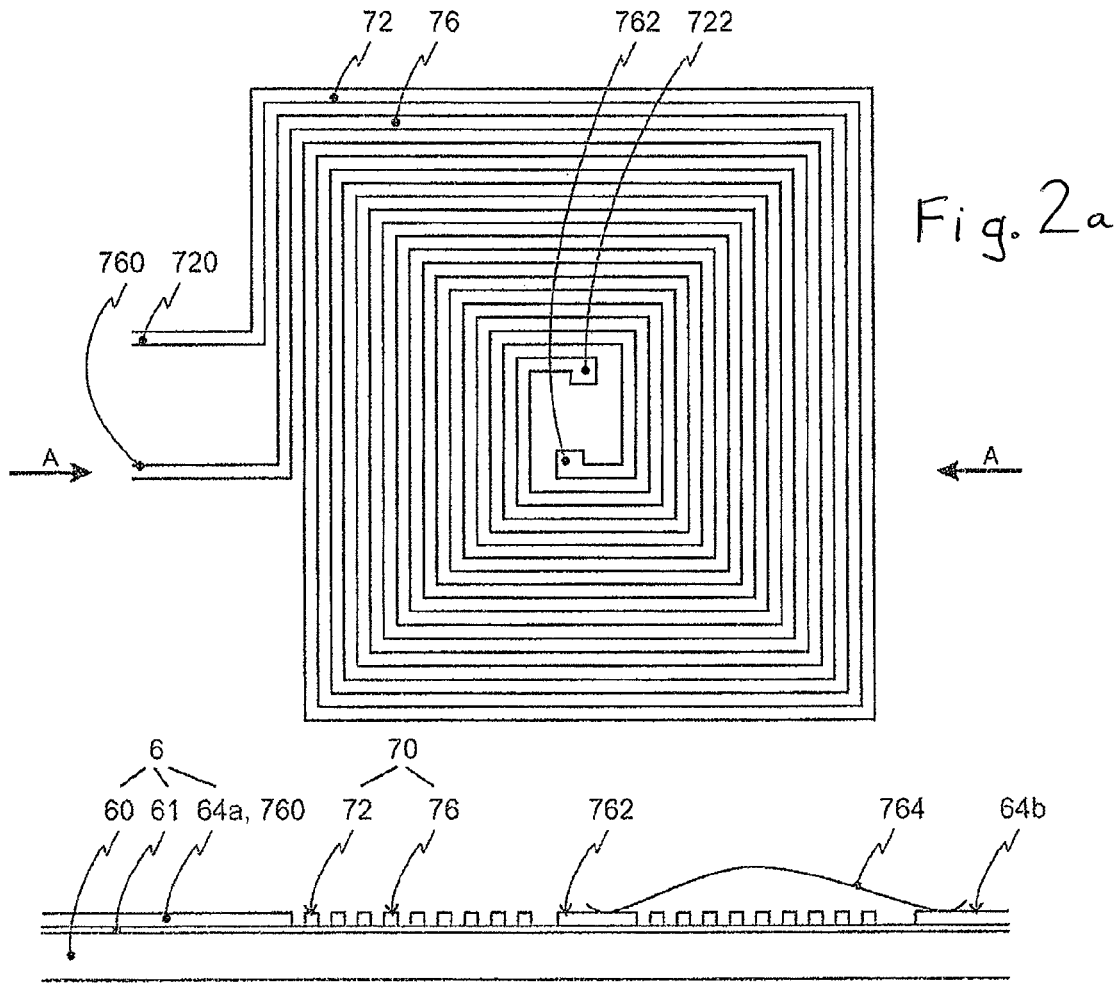
Fig. 2a
Fig. 2b

POWER SEMICONDUCTOR MODULE WITH CONTROL FUNCTIONALITY AND INTEGRATED TRANSFORMER

BACKGROUND OF THE INVENTION

1. Field of the Invention

The invention is directed to a power semiconductor module with control functionality, and, more particularly, to a power semiconductor module which includes not only power semiconductor components but also parts of an associated driver circuit.

2. Description of the Related Art

The entire driver circuit of a power semiconductor module, at least for relatively high voltages beyond 100V, usually has two potential-isolated circuit parts: a primary side and a secondary side. Transformers are often used for the signal transmission or the voltage supply between said circuit parts. Such transformers are typically constructed analogously to a transformer comprising two coils and connected by a core. German Published Patent Application DE 101 00 282 A1 discloses transformers for arrangement on semiconductor bodies without a core connecting the two coils. However, such transformers have a lower efficiency.

Furthermore, German Published Patent Application DE 103 55 925 A1 discloses connecting devices composed of an alternating sequence of conductive and insulating layers for the circuit-conforming connection of the circuit arrangement of a power semiconductor module. According to this patent, the conductive layers are structured, and thus form connecting tracks that are electrically insulated from one another. Such connecting devices are particularly preferred for compact constructions of power semiconductor modules. Moreover, it is already known to arrange control components on such connecting devices and, required for the function thereof, resistors and capacitors on a conductive layer.

The integration of control functionality in a power semiconductor module is likewise known, for example from German Published Patent Application DE 10 2006 021 412 A1. In this case, control components and, if necessary, further components such as resistors and capacitors, and connected in a circuit-conforming manner by means of conductor tracks on a substrate where the conductor tracks are usually provided for the arrangement of the power semiconductor components. Further components, primarily those having larger dimensions than the power semiconductor component, are, however, usually arranged outside the power semiconductor module.

SUMMARY OF THE INVENTION

It is an object of the invention to provide a power semiconductor module in which further control functionality is integrated.

Briefly stated, the invention is directed to a power semiconductor module comprising a substrate and conductor tracks arranged thereon. The conductor tracks are electrically insulated from one another, and have power semiconductor components arranged thereon. The components are electrically conductively connected to a respective assigned conductor track of the substrate.

A connecting device provides circuit-conforming connection of power semiconductor components, conductor tracks and/or external contact devices. In this case, an alternating layer sequence of at least two electrically conductive layers and at least one electrically insulating layer arranged therebetween serves as the connecting device. For this purpose, the electrically conductive layers are inherentently structured and form connecting tracks that are electrically insulated from one another.

The power semiconductor module furthermore has control functionality by means of which the power semiconductor components of the power semiconductor module are driven by externally applied signals. For this purpose, control components and preferably also further components such as resistors and capacitors are arranged on at least one electrically conductive layer of the connecting device. This at least one control component and the further components are electrically contact-connected by means of the connecting tracks.

According to the invention, the power semiconductor module has at least one transformer formed integrally from the constituent parts of the connecting device, and being electrically conductively connected to a control component by means of connecting tracks. Specifically, the windings of the transformer are formed from connecting tracks of the connecting device. It is preferred for the transformer to be composed of at least one transmitter coil and at least one receiver coil, which are in each case embodied in spiral fashion and are arranged coaxially with respect to one another. In principle, more than one winding can be formed by the connecting tracks of an electrically conductive layer of the connecting device. Preferably, however, the windings of a transformer lie on different electrically conductive layers of the connecting device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIG. 1 is a highly schematic cross-section of the inventive power semiconductor module;

FIG. 2a is a plan view of a first embodiment of the inventive power semiconductor module;

FIG. 2b is a cross-section of the embodiment of FIG. 2a;

FIG. 4b is a cross-section of the embodiment of FIG. 4a.

DETAILED DESCRIPTION OF THE PRESENTLY PREFERRED EMBODIMENTS

Figure 3:
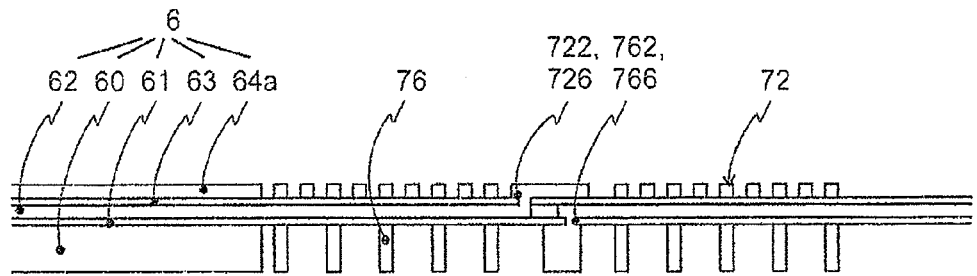
FIG. 3 is a schematic cross-section of a second embodiment of the inventive power semiconductor module.

FIG. 1 is a highly schematic cross-section taken through a first embodiment of the inventive power semiconductor module 1 which includes a connecting device 6. In this case, the illustration shows as an example only, and without limitation, a substrate 2 such as is known as a so-called DCB (direct copper bonding) or IMS (integrated metal substrate) substrate. Substrate 2 has an insulating layer with conductor tracks 3 arranged thereon. One conductor track 3 here carries an unpackaged semiconductor component 4, for example a power transistor, such as is often used for driving three-phase motors.

A sintering metal layer is preferably arranged for the electrically conductive connection of conductor track 3 carrying the semiconductor component 4 and a contact area on the first main area of the semiconductor component 4. The sintering metal layer arises during the sintering process of production from a suspension comprising a solvent and noble metal flakes and subsequently constitutes a highly reliable electrically conductive connection.

The second main area of the semiconductor component 4 has two contact areas providing an electrically conductive connection to connecting device 6, wherein these connections are also preferably sintering connections. Connecting device 6 likewise has contact areas 20 with conductor tracks 3 of the substrate 2.

Connecting device 6 itself here has an alternating construction composed of three layers (cf. FIG. 2), wherein the layer sequence, as viewed from the substrate, begins with a first electrically conductive layer, which is followed by a first insulating layer and then a second conductive layer again. The first conductive layer principally serves for the load connection of the power semiconductor component 4, while the second conductive layer, which is configured to be thinner here, carries the control signals.

The control signals, like the load currents, are fed into the connecting device 6 by means of an external contact device 10, here embodied schematically as a screw connection. In this case, rather than completely conditioned controlled signals, only fundamental control commands are fed in, which commands are converted into corresponding control signals by means of the control functionality which, according to the invention, is an integral part of the power semiconductor module. For this purpose, control components 8 and also—not illustrated—further components such as resistors and capacitors are arranged on the second conductive layer. Furthermore, for potential-isolated level conversion, a transformer 70 is integrated into the connecting device 6 itself.

FIG. 2 shows, both in plan view (FIG. 2*a*) and in section (FIG. 2*b*), a detail of a first embodiment of a power semiconductor module according to the invention. Here the illustration shows exclusively a part of connecting device 6 with a transformer 70 integrated therein. Transformer 70 has in each case one transmitter coil 76 and one receiver coil 72, which are arranged coaxially with respect to one another. Since the respective windings of transmitter coil 76 and receiver coil 72 are co-planar, they are embodied as square spirals having a respective first contact location 760, 720 at the outer beginning of the spiral and a respective second contact location 762, 722 inside the spiral.

The windings of transmitter coil 76 and receiver coil 72 are formed from connecting tracks 64*a* and can thus be produced in one operation with the remaining connecting tracks 60, 64 of connecting device 6, that is to say including the supply lines to the respective first contact location 722, 760 of the respective coil. For connecting the second contact locations 722, 762 to respective further connecting tracks 64*b*, bonding connections, preferably wire bonding connections 746, are provided.

In this embodiment of transformer 70, the windings of the respective coils 72, 76 are arranged on the same, here the second, electrically conductive layer 64 of connecting device 6 and are interleaved in one another in such a way that the spiral connecting tracks of the transmitter coil 76 alternate with those of the receiver coil 72 in terms of their lateral position parallel to the surface of the connecting device 6. The electrical insulation of the two coils 72, 76 from one another is achieved by spacing apart the connecting tracks that form their windings from one another.

FIG. 3 schematically shows a detail of a second embodiment of a power semiconductor module according to the invention in section. The illustration here in turn shows only a part of connecting device 6 with transformer 70 integrated therein. This transformer 70 has in each case one transmitter coil 76 and one receiver coil 72, which are arranged coaxially with respect to one another. However, the respective circular-spiral windings of the transmitter coil 76 and receiver coil 72 lie in different planes on different electrically conductive layers 60, 64 of the connecting device 6. In this configuration, in contrast to the illustration in accordance with FIG. 2, the transmitter coil 76 and the receiver coil 72 additionally have a different number of windings.

The electrical insulation of the two coils 72, 76 from one another is achieved here by insulating layers 61, 63 of the connecting device 6. Further basic construction of the respective windings from the connecting tracks is identical to that in accordance with FIG. 2.

For connecting the respective second contact devices 722, 762 of coils 72, 76, connecting device 6 has a further electrically conductive layer 62, the connecting tracks of which form the supply lines to the respective second contact locations 722, 762. For this purpose, this further conductive layer 62 is arranged between the other two conductive layers 60, 64 and isolated therefrom in each case by an insulating layer 61, 63. Each insulating layer 61, 63 furthermore has a respective plated through-hole 726, 766 for electrically conductively connecting the respective second contact location 722, 762 to the respectively assigned connecting track 62 of the further conductive layer 62.

Figure 4A:
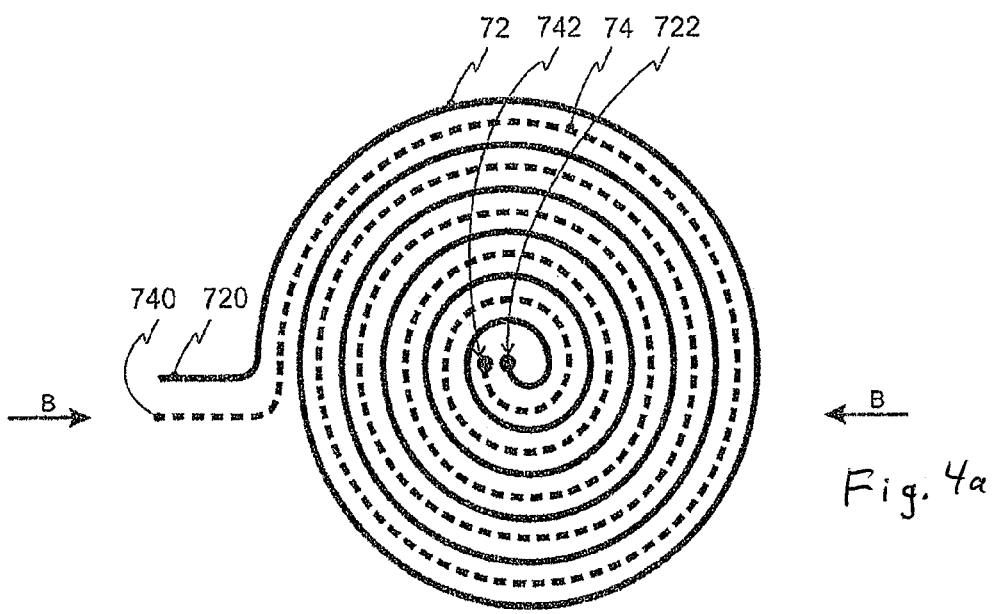
FIG. 4a is a plan view of a third embodiment of the inventive power semiconductor module.
Figure 4B:
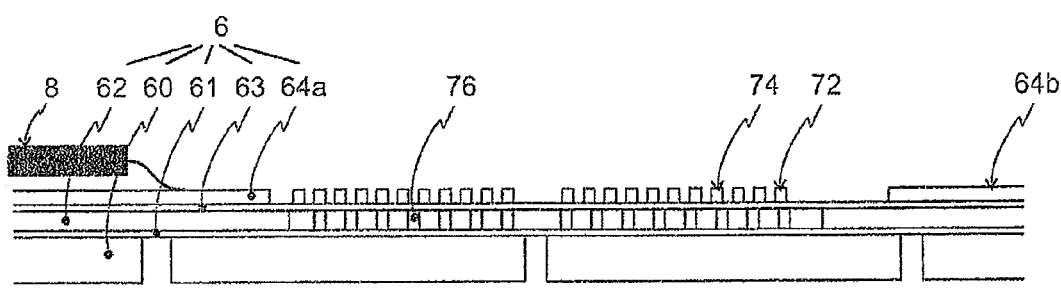

FIG. 4 schematically shows, both in plan view (FIG. 4*a*) and in cross-section (FIG. 4*b*), a detail of a third embodiment of the inventive power semiconductor module. The illustration here likewise shows exclusively a part of the connecting device 6, here in turn embodied with three electrically conductive layers 60, 62, 64 and two insulating layers 61, 63 respectively arranged therebetween. The second 64 and further 62 electrically conductive layers serve in each case to carry the control signals, in which case, in this configuration, transformer 70 has a transmitter coil 76 and two receiver coils 72, 74 also formed from these two layers.

Since three coils 72, 74, 76 of transformer 70 are to be arranged here, transmitter coil 76 is arranged on the further electrically conductive layer 62 and two receiver coils 72, 74 are arranged on the second electrically conductive layer 64. The two receiver coils 72, 74 are arranged in a manner interleaved in one another analogously to the two coils in FIG. 2, whereby all three coils 72, 74, 76 are arranged coaxially with respect to one another.

In this embodiment, it is likewise preferred for the second contact locations of each transmitter coil 76 or receiver coil 72, 74 to be connected to a conductor track of a directly or indirectly adjacent electrically conductive layer by means of a plated through-hole through at least one insulating layer 61, 63. The first electrically conductive layer 60, on which load currents are usually carried, is appropriate for this purpose. When the first electrically conductive layer 60 is utilized, it is possible, without this being explicitly illustrated, for the second contact location to be connected to an assigned connecting track on the second 64 or further 62 electrically conductive layer in a simple manner and by means of further plated through-holes in circuit-conforming fashion.

The illustration furthermore shows the direct connection of one of the two receiver coils 72 to a control component 8. Both the coils and connecting tracks, both those which serve for connection to the control component 8 and all others of this electrically conductive layer, are, in principle, produced and embodied in technically identical fashion.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a substrate;
   a plurality of conductor tracks arranged on said substrate, said conductor tracks being electrically insulated from one another;
   power semiconductor components arranged on said conductor tracks; and
   a connecting device including an alternating layer sequence of at least two electrically conductive layers and at least one electrically insulating layer disposed between two conductive layers, for the circuit-conforming connection of said power semiconductor components, said conductor tracks and/or external contact devices, and a transformer formed integrally from the constituent parts of said connecting device;
   wherein said electrically conductive layers form connecting tracks.

2. The power semiconductor module of claim 1, wherein said transformer includes at least one transmitter coil and at least one receiver coil, which are arranged coaxially with respect to one another; are formed with spiral windings and have respective first and second contact locations.

3. The power semiconductor module of claim 2, wherein the respective windings of said transmitter coil and said receiver coil are composed of said connecting tracks.

4. The power semiconductor module if claim 3, wherein at least one of said transmitter coils and at least one of said receiver coils are co-planar, and are arranged on the same electrically conductive layer and interleaved in one another, whereby the coils are electrically insulated from one another by said connecting tracks that form them, being spaced apart from one another.

5. The power semiconductor module of claim 3, wherein at least one of said transmitter coils and at least one of said receiver coils are arranged on adjacent electrically conductive layers and are electrically insulated from one another by at least one insulating layer.

6. The power semiconductor module of claim 3, wherein at least one transmitter coil is arranged on one electrically conductive layer and at least two receiver coils are arranged on a different electrically conductive layer and said receiver coils are interleaved in one another in said different electrically conductive layer.

7. The power semiconductor module of claim 2, wherein the first contact location of at least one of said transmitter coil and said receiver coil is integrally and directly connected, to one of said connecting tracks thereby forming the supply line of the coil so connected.

8. The power semiconductor module of claim 2, wherein the second contact location of at least one of said transmitter coils and said receiver coils is connected to a further conductor track of the same electrically conductive layer by means of a bonding connection or to a conductor track of a further electrically conductive layer by means of a plated through-hole through at least one insulating layer.

9. The power semiconductor module of claim 2, wherein the second contact location of at least one of said transmitter coils and said receiver coils is connected to a further conductor track of the same electrically conductive layer by means of a bonding connection or to a conductor track of a further electrically conductive layer by means of a plated through-hole through at least one insulating layer.

10. The power semiconductor module of claim 1, wherein at least one control component is arranged on at least one electrically conductive layer and is connected to connecting tracks there and to said transformer.

* * * * *